United States Patent [19]
Akutsu et al.

[11] Patent Number: 5,701,041
[45] Date of Patent: Dec. 23, 1997

[54] WEIGHT SUPPORTING APPARATUS

[75] Inventors: Kotaro Akutsu, Soka; Eiji Osanai; Shigeto Kamata, both of Yokohama, all of Japan

[73] Assignee: Canon Kabushiki Kaisha, Tokyo, Japan

[21] Appl. No.: 316,887

[22] Filed: Oct. 3, 1994

[30] Foreign Application Priority Data

Oct. 12, 1993 [JP] Japan .................... 5-277325

[51] Int. Cl.⁶ .................... H02K 33/18; B23Q 1/38
[52] U.S. Cl. .................... 310/12; 318/611; 318/135; 74/479.01; 108/43; 248/661
[58] Field of Search .................... 310/12, 13, 14; 318/135, 611, 615; 361/144, 146; 324/207.12, 207.13, 207.11; 108/43; 248/661; 33/568, 1 M; 74/479.01

[56] References Cited

U.S. PATENT DOCUMENTS

| 4,798,985 | 1/1989 | Chitavat | 310/90 |
|---|---|---|---|
| 5,040,431 | 8/1991 | Sakino et al. | 74/479.01 |
| 5,184,055 | 2/1993 | Ohishi et al. | 318/615 |
| 5,280,677 | 1/1994 | Kubo et al. | 33/568 |
| 5,479,145 | 12/1995 | Kalsi | 310/14 X |

FOREIGN PATENT DOCUMENTS 0130358  1/1985  European Pat. Off. .

OTHER PUBLICATIONS

Patent Abstract of Japan, vol. 10, No. 367, published Dec. 9, 1986.
English Abstract of Japanese Patent No. 61-161950, published Jul. 22, 1986.
Patent Abstracts of Japan, vol. 10, No. 73, published Mar. 22, 1986.
English Abstract of Japanese Patent No. 60-217033, published Oct. 30, 1985.
Patent Abstract of Japan, vol. 17, No. 694, published Dec. 17, 1993.
English Abstract of Japanese Patent No. 5-237787, published Sep. 17, 1993.

Primary Examiner—Steven L. Stephan
Assistant Examiner—Judson H. Jones
Attorney, Agent, or Firm—Fitzpatrick, Cella, Harper & Scinto

[57] ABSTRACT

A weight supporting apparatus supports the weight of a structure required to have very high surface precision, without affecting the surface precision of the structure. The weight support apparatus includes a driving unit for moving a driven body in the direction of gravity with respect to a base, and a supporting unit for supporting the weight of the driven body at a position after being driven, wherein the driving unit and supporting unit are so arranged that the drive force of the driving unit and the support force of the supporting unit are on the same axis.

20 Claims, 7 Drawing Sheets

WEIGHT SUPPORTING APPARATUS

BACKGROUND OF THE INVENTION

1. Field of the Invention

The present invention relates to a weight supporting apparatus for supporting the weight of a machine structure, which may be applied to XY stages for semiconductor fabricating apparatus, precision machine tools, accurate measuring instruments, etc.

2. Related Background Art

FIG. 12 shows an example in which a weight supporting apparatus is mounted in a machine structure. In FIG. 12, numeral 1 designates a tilt stage. For example, for mounting a wafer 3, the top surface 2 of tilt stage 1 needs to have very high surface precision. Numeral 4 denotes a guide for restricting only a horizontal (Y-directional) motion of the tilt stage 1, which allows motions in the vertical direction (Z-direction), in an oblique direction, and in a direction of rotation about the Z-axis, for example, using a hydrostatic bearing. Through non-contact drive by a plurality of linear motors 26 (26a, 26b, . . .), a position along the Z-direction or the direction of gravity, or inclination of tilt stage 1 can be automatically controlled at a high speed with respect to a base 6. Also, numeral 27 designates an air cylinder, and one or more air cylinders support the weight of tilt stage 1.

Since the linear motors 26 transmit a force in a non-contact state, they have such an effective characteristic that Z-directional vibration of base 6 is not transmitted to the tilt stage 1. On the other hand, because the heat generated by a linear motor is proportional to the square of an electric current flowing therethrough, heat becomes enormous with an increase of the drive force. Thermal deformation of machine structure caused by the heat would result in a fatal defect, such as thermal deformation, for example, of a wafer mounted on the tilt stage, of the device as an accurate instrument. Accordingly, a design to minimize the drive force is required for applications of the linear motor to accurate instruments. Thus, as in the above example, an air cylinder or the like is interposed so as to support the weight of the tilt stage.

SUMMARY OF THE INVENTION

However, the above example for driving, for example, the causing tilting of the wafer, has the following problems.

(1) The tilt stage could be deformed by excessive constraint because the point of drive of linear motors is not coincident with the weight support point by the air cylinder.

(2) In order to keep the amount of deformation below a permissible value, it is necessary to receive the weight with a plane instead of the support point or to increase the thickness of the tilt stage so as to enhance the rigidity of the structure, which increases the size of the apparatus.

In either case, the amount of deformation is very small, but it would be a great error factor for structures requiring very high surface precision, such as the tilt stage for a wafer. Thus, substantial improvement has been desired.

The present invention has been developed in view of the above problems, and an object of the invention is to provide a weight supporting apparatus which can be used in structures requiring very high surface precision without affecting the surface precision.

To achieve the above object, a weight supporting apparatus of the present invention comprises driving means for moving a driven body from a base in the direction of gravity, and supporting means for supporting the weight of the driven body at a position after being driven, wherein the drive force of the driving means and the support force of the supporting means are arranged on the same axis. In a weight supporting apparatus for moving the driven body from the base in the direction of gravity or inclining it, the apparatus may be provided with a plurality of sets of the driving means and the supporting means arranged in such a manner that the drive force of the driving means and the support force of the supporting means are arranged on the same axis.

In the present invention, the driven body can be held by a hydrostatic fluid bearing, such as a porous hydrostatic bearing, so as to restrict the degree of horizontal freedom relative to the base but to allow the other degrees of moving freedom relative to the base. The degree of horizontal freedom of the driven body is restricted by a fixed guide having a cylindrical guide surface located on the base, for example, and the driven body is supported through a fluid lubricating film in the radial direction of the fixed guide.

The driving means is, for example, a linear motor, and the supporting means is, for example, an air cylinder. In this case, the linear motor is composed of a permanent magnet, a coil, and a member for holding the coil, and is preferably arranged to have a pipe line for the flow of refrigerant in at least either one of the member for holding the coil or the surface of the coil. The air cylinder is composed of a cylinder, a piston, and a seal, such as a bellow diaphragm. Each of horizontal cross sections of the cylinder, the piston, and the seal preferably has the shape of a pair of semi-circular arches and a pair of parallel straight lines connecting the semi-circular arches. Further, the apparatus is preferably provided with a control device for controlling the pressure in the air cylinder. The control device may use the pressure in the air cylinder or the electric current through the linear motor as a feedback signal.

Since the above problems were caused by the fact that the drive point of the linear motor and the weight support point are not coincident with each other, the present invention overcame these problems by making them coincident with each other. Specifically, the linear motor and air cylinder are arranged on the same axis. Further, in order to facilitate assembling of the apparatus and to effectively utilize the space, the air cylinder is arranged to have a cross section of a track shape and is designed in a unit with the linear motor.

DETAILED DESCRIPTION OF THE PREFERRED EMBODIMENTS

Figure 1:
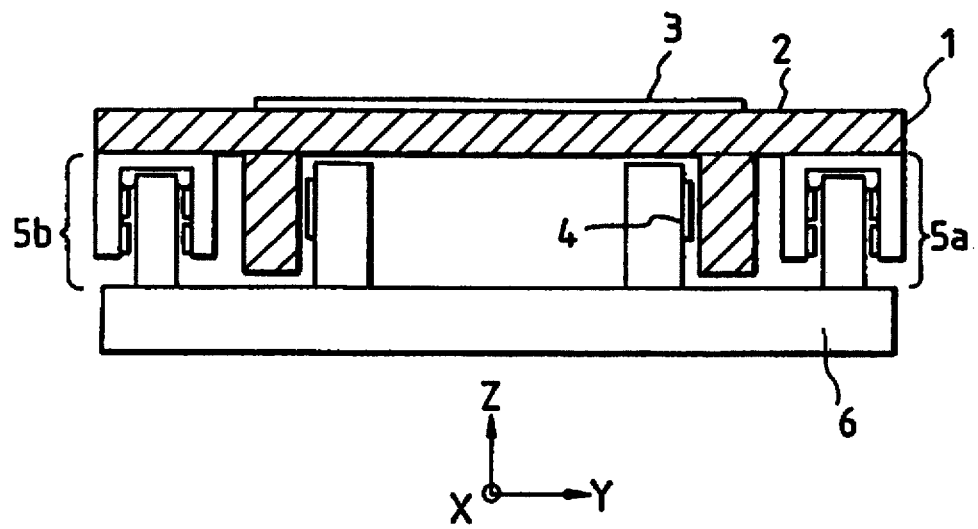
FIG. 1 is a cross-sectional view of a tilt stage in which a weight supporting apparatus according to an embodiment of the present invention is mounted.

FIG. 1 shows a tilt stage in which weight supporting apparatus of the present invention are mounted. In FIG. 1, reference numeral 1 designates a tilt stage, and the top surface 2 of the tilt stage is required to have very high surface precision for mounting the wafer 3 thereon. Numeral 4 denotes a guide for restricting only movement of the tilt stage substantially in the Y- (horizontal) direction. For example, using a porous hydrostatic bearing, motions substantially in the Z- (vertical) direction, in an oblique direction, and in the direction of rotation about the Z-axis are allowed. Numeral 6 denotes a base. The guide 4 is fixed on the base 6 and a guide surface of guide 4 is cylindrical and extends in the Z-direction. Numerals 5a and 5b denote the weight supporting apparatus of the present invention. Driving the three weight supporting apparatus (one of which is not shown), a position in the Z-direction or in the direction of gravity or the inclination of stage 1 can be automatically controlled at a high speed with respect to the base 6.

Figure 2:
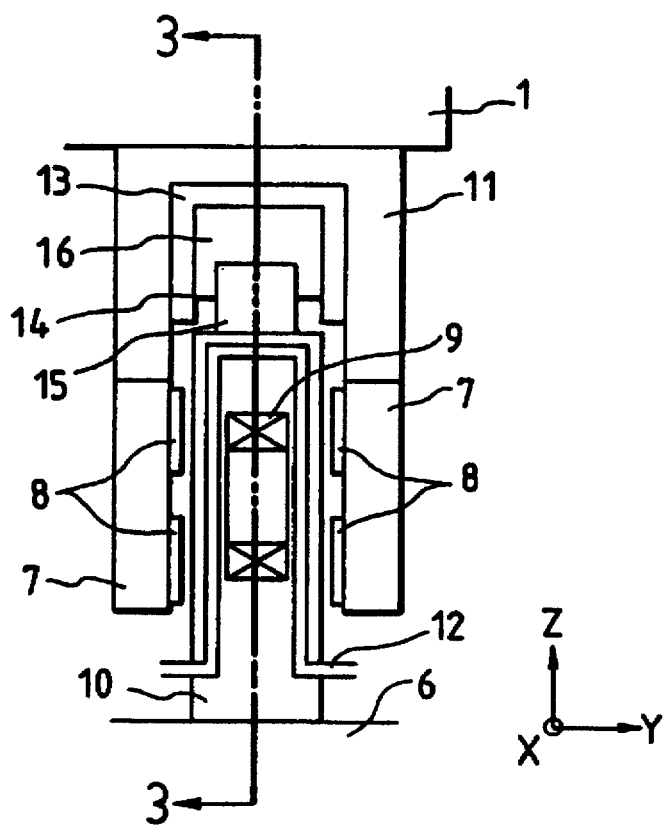
FIG. 2 is an enlarged view of the weight supporting apparatus in FIG. 1.
Figure 3:
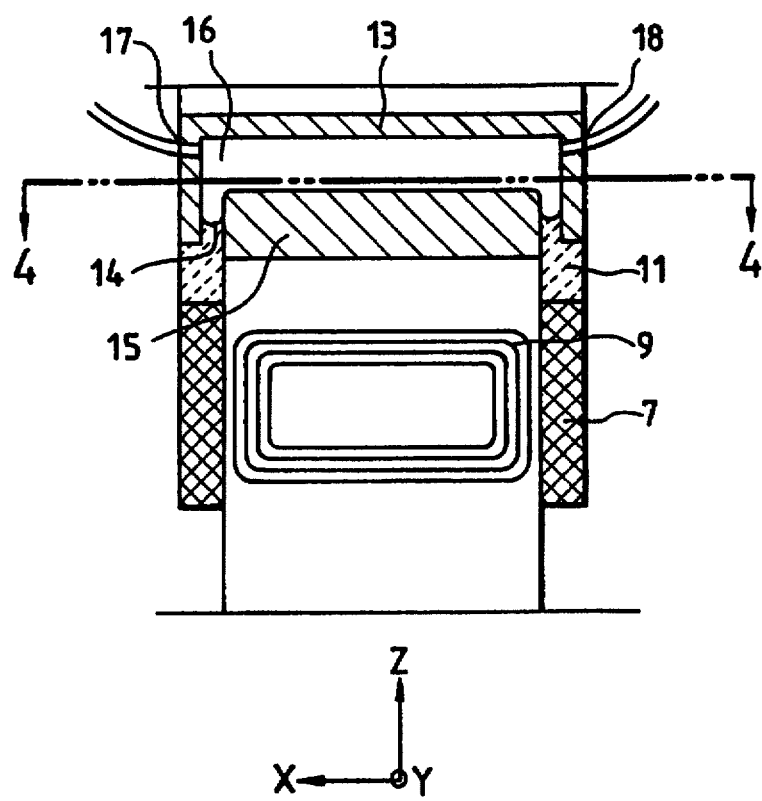
FIG. 3 is a cross-sectional view along 3—3 in FIG. 2.
Figure 4:
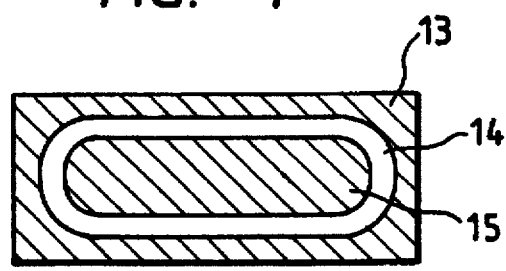
FIG. 4 is a cross-sectional view along 4—4 in FIG. 3.

FIG. 2 is an enlarged view of the tare supporting apparatus 5a in FIG. 1. FIG. 3 is a cross-sectional view along 3—3 of the weight supporting apparatus in FIG. 2. FIG. 4 is a cross-sectional view along 4—4 of the weight supporting apparatus in FIG. 3. The weight supporting apparatus shown in FIGS. 2 to 4 is composed of a linear motor portion and a weight supporting portion. The linear motor portion is composed of permanent magnets 8, a coil 9, a coil holder 10 of a non-magnetic body, a yoke 7 of a magnetic body, and a yoke holder 11. The coil holder 10 is equipped with a cooling pipe 12 covering the coil in order to recover heat generated by the coil, whereby a refrigerant can be made to flow from the outside through the pipe. The direction of a magnetic field of the permanent magnets and the direction of an electric current flowing through the coil are so arranged that the Lorentz force acts in the Z direction. In such an arrangement, the external size of the linear motor portion is determined so that the X-directional length is longer than the Y-directional length.

Figure 5A:
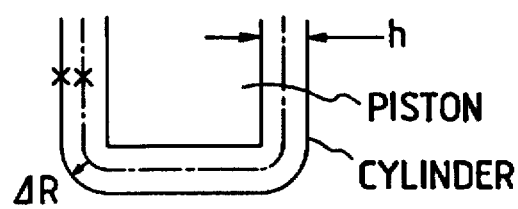
FIGS. 5A and 5B are drawings to illustrate the strain on a seal in the case of a rectangular cross section of a piston.
Figure 5B:
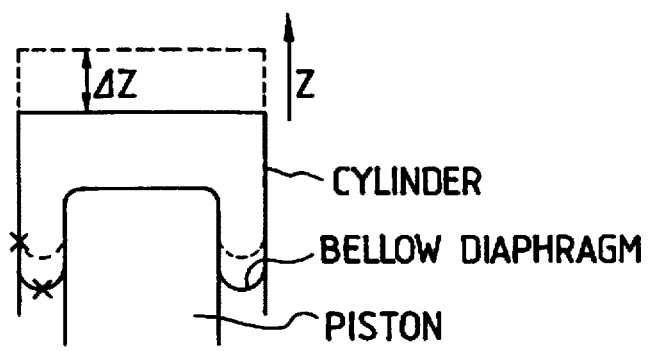

The weight supporting portion is composed of a track-shape cylinder 13, a track-shape piston 15, and a track-shape bellow diaphragm seal 14. An air room 16 between the track-shape cylinder 13 and the track-shape piston 15 is perfectly sealed by the track-shape bellow diaphragm 14. The track-shape piston 15 is fixed to the coil holder 10. The track-shape cylinder 13 is fixed to the yoke holder 11. By this arrangement, a force generated by the linear motor and a force generated by the track-shape cylinder 13 work on a same axis along the Z direction, so as to drive the tilt stage 1 through the yoke holder 11. Each of horizontal cross sections of the track-shape cylinder 13, the track-shape piston 15, and the track-shape bellow diaphragm 14 has a shape, as shown in FIG. 4, composed of a pair of semi-circular arches and a pair of parallel straight lines connecting them. Although the cross sections of normal bellow diaphragms are circular, a cross section of a track shape is preferable to effectively utilize the rectangular space provided between the coil holder and the yoke in the linear motor portion. If the cross section of the bellow diaphragm were rectangular, enormous strain would occur at the corners of the bellow diaphragm during operation of the cylinder, which would cause breakage of the bellow diaphragm. This will be described with FIGS. 5A, 5B and FIGS. 6A, 6B. FIGS. 5A and 5B show a bellow diaphragm having a rectangular cross section of a piston and a small curvature for the corners, while FIGS. 6A and 6B a bellow diaphragm having a circular cross section. In FIGS. 5B and 6B (side views), when the cylinder moves by an amount $\Delta Z$ (from the solid line to the dashed line) in the Z direction, the bellow diaphragm expands by an amount $\Delta R$ from the chain line to the position of the cylinder in FIGS. 5A and 6A (top plan views). Then the strain $\epsilon$ of the bellow diaphragm is expressed by the below formulas, where h is a gap between the piston and the cylinder and R is the diameter of piston.

For the case of FIGS. 5A and 5B, the strain at the corners is $$\epsilon = \{2\pi h - 2\pi(h/2)\}/\{(2\pi(h/2))\} = 1.$$

Figure 6A:
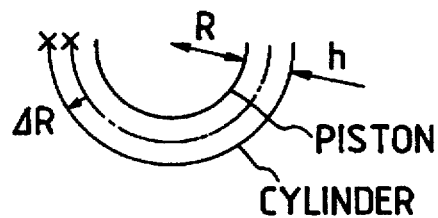
FIGS. 6A and 6B are drawings to illustrate the strain on a seal in the case of a circular cross section of a piston.
Figure 6B:
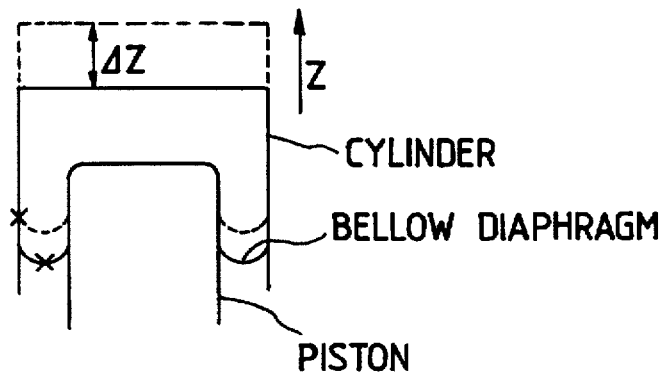

For the case of FIGS. 6A and 6B, $$\epsilon = \{h/2\}/\{R + h/2\} \ll 1.$$

Since the track-shape bellow diaphragm has the shape composed of a pair of semi-circular arches and a pair of parallel straight lines connecting them, it can be approximated to the case of FIGS. 6A and 6B, thus having small strain.

Figure 7:
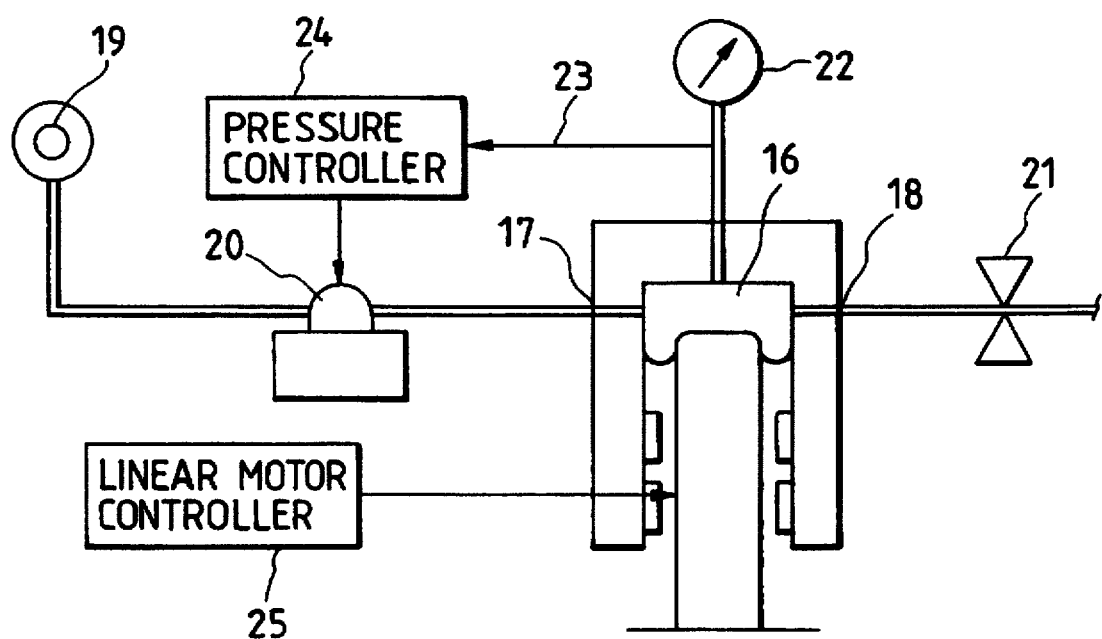
FIG. 7 is a drawing to show structure of an example of a drive system in the weight supporting apparatus of the present invention.

The drive system in the weight supporting apparatus is next described. In FIG. 7, numeral 19 designates an air supply source. Numeral 17 is an air supply port and numeral 18 denotes an air exhaust port. Numeral 20 is a servo valve for controlling the pressure of air. Numeral 21 denotes a diaphragm, which is open to the air on the secondary side. Numeral 24 is a pressure controller for giving the servo valve an instruction. Numeral 22 is a pressure gauge for measuring the cylinder pressure. The pressure controller uses a signal 23 from the pressure gauge as a feedback signal, thus realizing a control system for keeping the pressure in the cylinder constant. Because of the constant pressure control system, the weight supporting portion has no static rigidity. Numeral 25 is a linear motor controller including a current amplifier, for driving the linear motor.

Figure 8A:
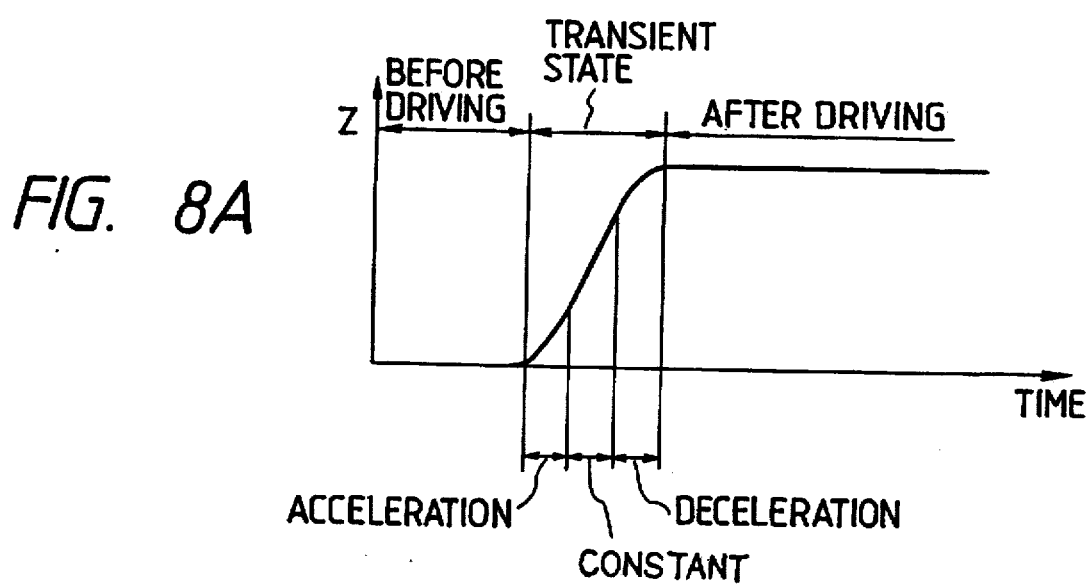
FIGS. 8A to 8D are drawings to show operational characteristics of the weight supporting apparatus of the present invention when a tilt stage is driven in the Z-direction.
Figure 8B:
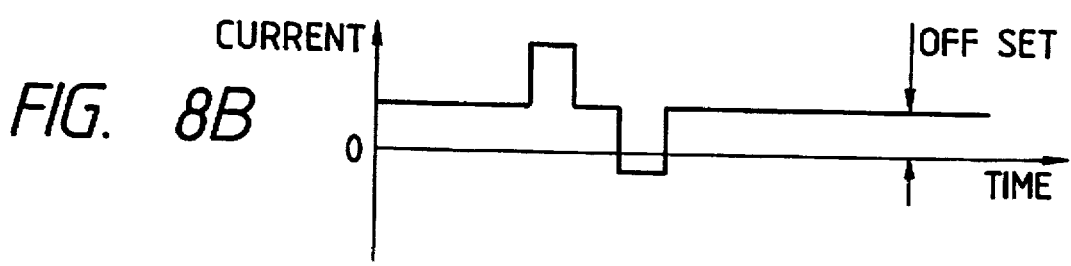
Figure 8C:
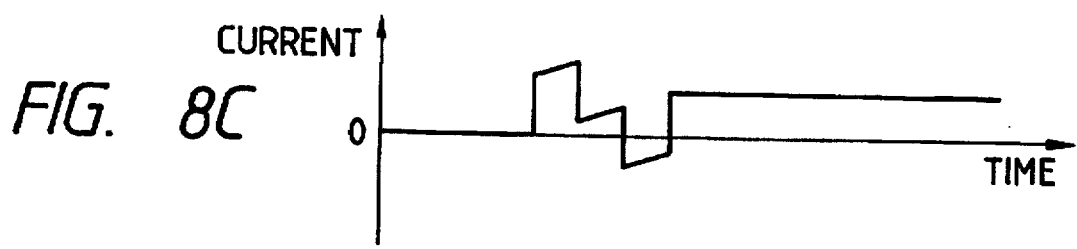
Figure 8D:
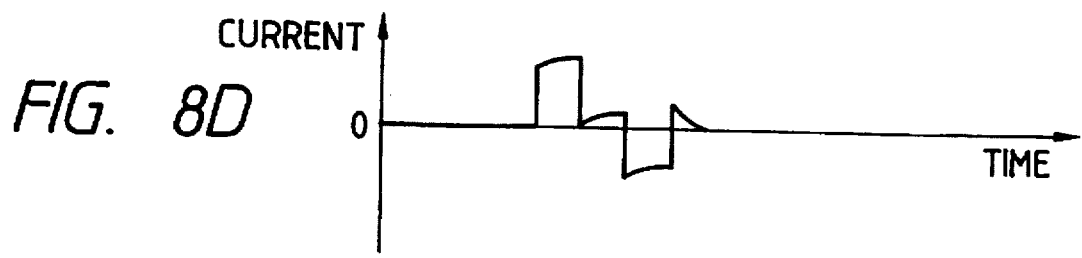

FIGS. 8A to 8D show the operational characteristics of three types of weight supporting apparatus including the weight supporting apparatus of the present invention. FIG. 8A shows a time response of Z-directional displacement of the tilt stage when these weight supporting apparatus are driven. The response consists of a state before driving, a transient state, and a state after driving, and the transient state can be further separated into an acceleration period, a constant-speed period, and a deceleration period. FIG. 8B to FIG. 8D show time signals of current values flowing through the linear motors in the respective weight supporting apparatus at each moment. A time signal can be considered as equivalent to a drive force of the linear motor. FIG. 8B shows a signal in a case without such a weight supporting portion as the air cylinder in the present invention. FIG. 8C shows a signal in a case employing a weight supporting method using a member with static rigidity, for example, such as a coil spring. FIG. 8D shows a signal in a case where the weight supporting apparatus of the present invention using the air cylinder is mounted as the weight supporting portion. In FIG. 8B, an offset appears before and after driving. This is because the linear motor always needs to produce a force balanced with the weight of the tilt stage, which is thermally disadvantageous as described previously. In FIG. 8C, no offset appears before driving but an offset appears after driving. This is because the linear motor produces no force before driving, i.e., at a balanced position between the weight and the coil, but the linear motor always needs to produce a force determined by a spring constant of the coil spring and a Z-directional displacement after driving. Although the spring constant of the coil spring is generally small, such an arrangement is also thermally disadvantageous in the cases where the drive displacement is large, similar to the case of FIG. 8B. In FIG. 8D, there appears no offset of the current value before and after driving, because the linear motor generates no static force in those periods. On the contrary, a large current flows in the transient state during driving, as compared with FIG. 8B. This is because the air cylinder used for supporting the weight serves as a spring element due to the compressibility of air against a momentary displacement. In order to decrease the transient current value, it is necessary to enhance the response of the pressure control system by the servo valve 20. The thermal effect, however, is very small, because the time period in which the current flows is short.

The present invention is by no means limited to the above-described embodiment, but may have various modifications with necessity. For example, the following modifications are possible.

Figure 9:
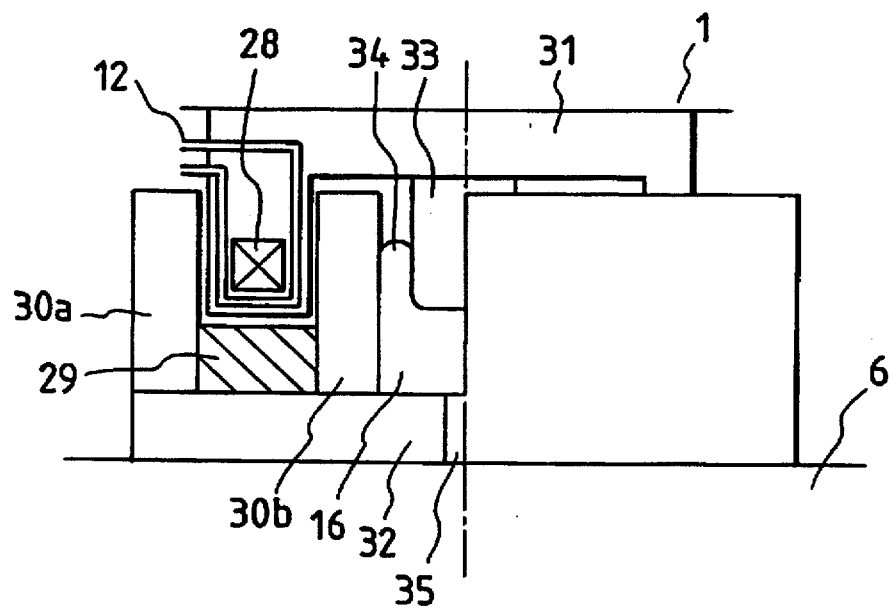
FIG. 9 is a drawing to show the structure of a weight supporting apparatus according to the second embodiment of the present invention.

(1) The above embodiment employs the track-shape air cylinder as the weight supporting portion, because there is a rectangular space between the coil holder and the yoke in the linear motor portion. Where a cylindrical linear motor such as a voice coil is employed, as shown in FIG. 9, a bellow diaphragm cylinder having a circular cross section can be used as the weight supporting portion. In this case, numeral 28 designates a cylindrical coil, 29 denotes a cylindrical permanent magnet, 30a, 30b denote cylindrical yokes, and 31 denotes a cylindrical coil holder. The coil holder 31 is equipped with a cooling pipe 12. Numeral 32 denotes a housing, and the housing and cylindrical yokes 30a, 30b constitute a cylinder. Numeral 33 is a cylindrical piston, 34 denotes a cylindrical bellow diaphragm, and 35 an air supply port.

(2) The above embodiment employs the track-shape air cylinder in order to be set in the rectangular space, but the air cylinder can be arranged with one or plural bellow diaphragm cylinders having a circular cross section. Since the pressure-receiving area in the cylinder decreases in that case, the pressure in the cylinder needs to be increased for supporting the weight.

(3) The above embodiment employs the bellow diaphragm as a seal. This is because it has advantages that no friction exists and that a perfect seal can be realized. For example, an O-ring or a labyrinth seal can be used depending upon the object to be used.

Figure 10:
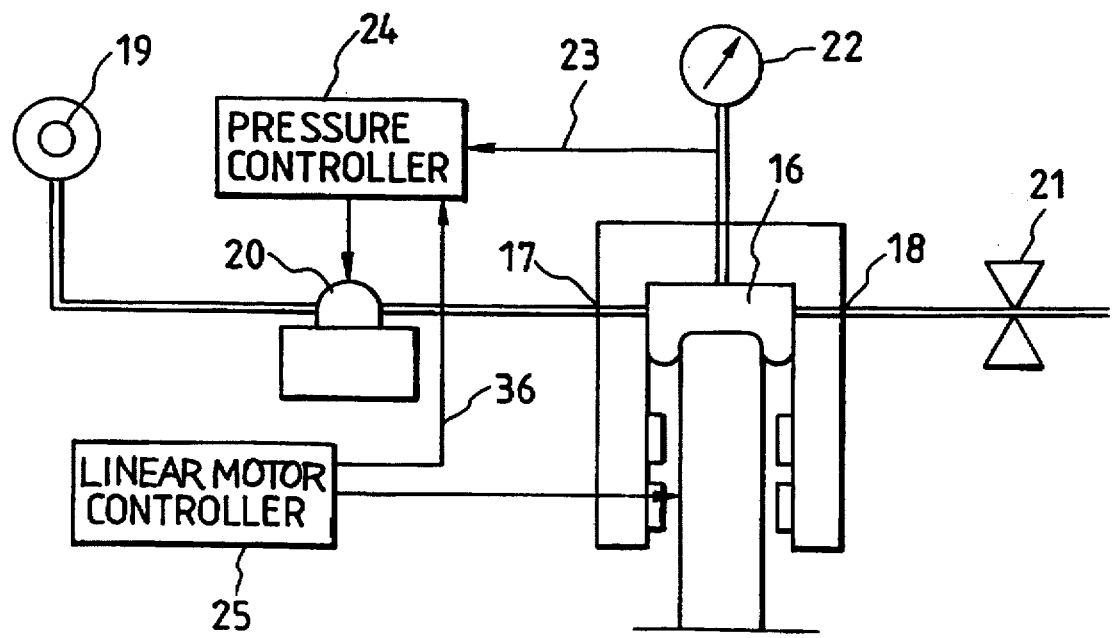
FIG. 10 is a drawing to show a second example of the drive system in the weight supporting apparatus of the present invention.

(4) The above embodiment employs a pressure control system which is a control system for keeping the pressure in the cylinder constant, but the control system can be constructed to drive the servo valve in such a manner that the electric current through the linear motor becomes zero, as shown in FIG. 10, using a value 36 of the current flowing through the linear motor as a feedback signal. In this case, the control can be realized with excellent response and accuracy.

Figure 11:
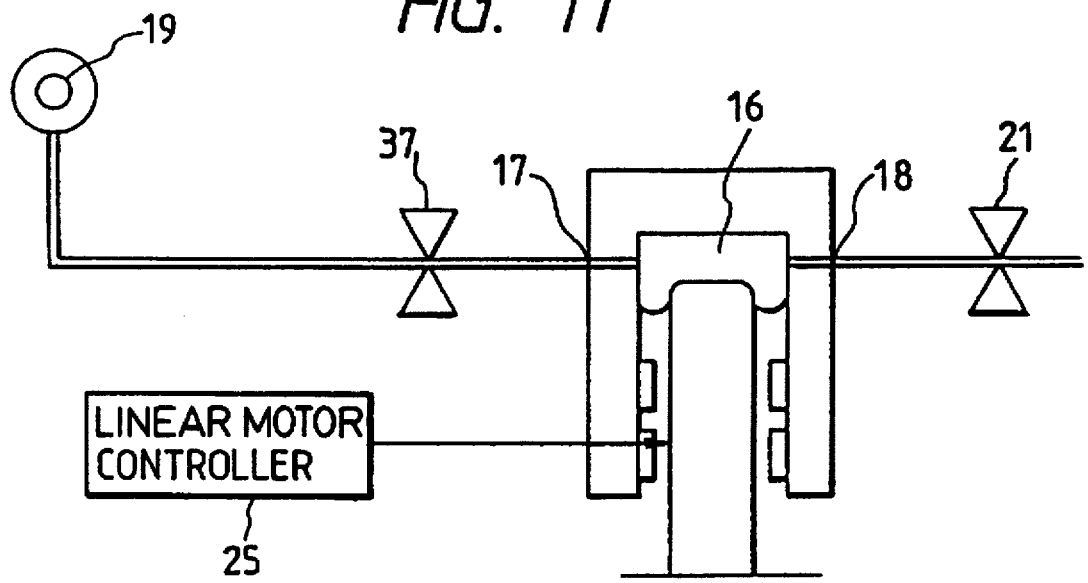
FIG. 11 is a drawing to show a third example of the drive system in the weight supporting apparatus of the present invention.
Figure 12:
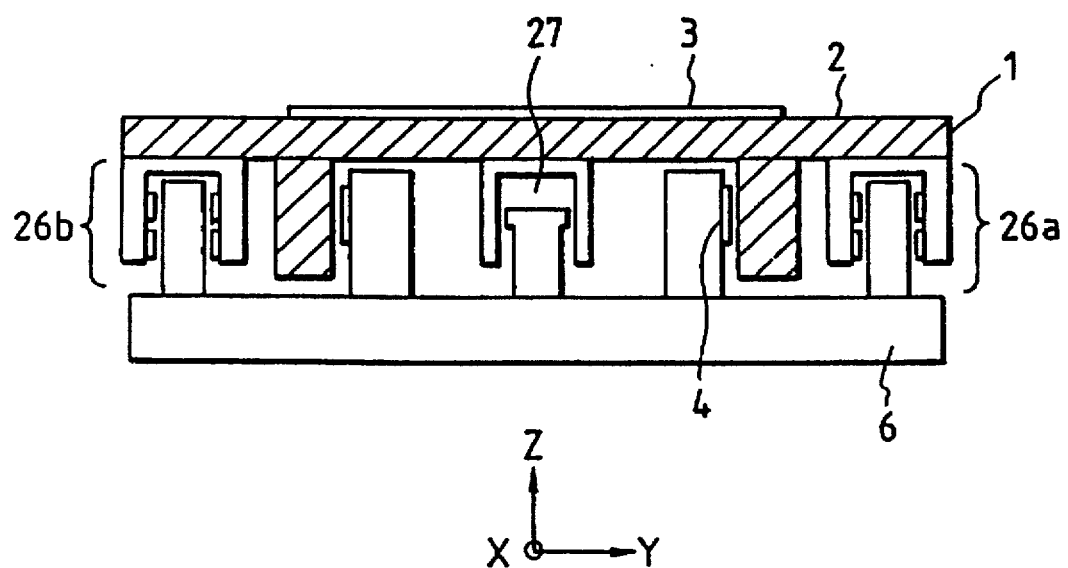
FIG. 12 is a cross-sectional view of a tilt stage in which a weight supporting apparatus is mounted.

The control system can also be realized in such an arrangement, as shown in FIG. 11, that a mechanical diaphragm 37, for example, such as a regulator, is provided on either side of the air supply port and the air exhaust port without using the servo valve. In that case, stability of the regulator needs to be sufficiently high.

According to the present invention, the weight can be supported without deformation of the structure. Also, a decrease of the load on the linear motors driving the structure and the flow of refrigerant can reduce the amount of heat emitted into the atmosphere from the linear motors. This results in decreasing a change in temperature of the structure and the atmosphere due to heating, which can suppress thermal deformation of structure and fluctuation of the air, thus realizing high accuracy and improvement in reliability of apparatus. Also, because of the design of unit arrangement, assembling of apparatus is easy.

What is claimed is:

1. A weight supporting apparatus, comprising:
   a base;
   a plurality of sets of driving means for moving a driven body above the base in the direction of gravity; and
   a plurality of sets of supporting means for supporting the weight of the driven body at a position after being driven, each set of said plurality of sets of driving means and supporting means being so arranged that the drive force of said driving means and the support force of said supporting means are on the same axis, wherein the driven body is moved in the direction of gravity or inclined relative to said base, wherein the driven body has a limited degree of freedom substantially in a horizontal direction with respect to said base and is held by a hydrostatic fluid bearing so as to be movable in said limited degree of freedom.

2. A weight supporting apparatus according to claim 1, wherein said hydrostatic fluid bearing is a porous hydrostatic bearing.

3. A weight supporting apparatus according to claim 1, further comprising a fixed guide having a cylindrical guide surface set on said base, wherein the driven body is supported through a fluid lubricating film in the radial direction of said fixed guide.

4. A weight supporting apparatus according to claim 1, wherein said plurality of sets of driving means comprise a linear motor and said plurality of sets of supporting means comprise an air cylinder.

5. A weight supporting apparatus according to claim 4, wherein said linear motor has a permanent magnet, a coil, and a coil holding member for holding the coil and wherein at least one of said coil holding member and said coil is provided with a pipe line for permitting the flow of refrigerant.

6. A weight supporting apparatus according to claim 4, wherein said air cylinder has a cylinder, a piston, and a seal, and wherein each of the horizontal cross sections of said cylinder, said piston, and said seal has a shape of a pair of semi-circular arches and a pair of parallel straight lines connecting said semi-circular arches.

7. A weight supporting apparatus according to claim 6, wherein said seal is a bellow diaphragm seal.

8. A weight supporting apparatus according to claim 4, further comprising control means for controlling pressure in said air cylinder.

9. A weight supporting apparatus according to claim 8, wherein said control means uses the pressure in said air cylinder as a feedback signal.

10. A weight supporting apparatus according to claim 8, wherein said control means uses a current signal of said linear motor as a feedback signal.

11. An apparatus for supporting the weight of a driven object with respect to a base, comprising:

driving means for generating a driving force for moving the driven object in a vertical direction with respect to the base;

supporting means for generating a supporting force for supporting the weight of the driven object with respect to the base, wherein the operating direction of said driving force generated by said driving means and the operating direction of said supporting force generated by said supporting means lie on substantially the same axis, and wherein a plurality of sets of said driving means and said supporting means are provided in said apparatus, whereby the driven object is moved in a vertical direction or inclined with respect to the base; and a hydrostatic fluid bearing for limiting the degree of freedom of the driven object with respect to the base in a horizontal direction and guiding the driven object so that the driven object can be moved with respect to the base in a direction except for the horizontal direction.

12. An apparatus according to claim 11, wherein said hydrostatic fluid bearing includes a porous hydrostatic bearing.

13. An apparatus according to claim 11, further comprising a fixed guide having a cylindrical guiding surface disposed on the base, wherein the driven object is supported through a fluid lubricating film in a radial direction of said fixed guide.

14. An apparatus for supporting the weight of a driven object with respect to a base comprising:

driving means for generating a driving force for moving the driven object in a vertical direction with respect to the base;

supporting means for generating a supporting force for supporting the weight of the driven object with respect to the base;

wherein the operating direction of the driving force generated by said driving means and the operating direction of the supporting force generated by said supporting means lie on substantially the same axis, wherein a plurality of sets of said driving means and said supporting means are provided in said apparatus, whereby the driven object is moved in a vertical direction or inclined with respect to the base and wherein said plurality of sets of driving means have a linear motor and said plurality of sets of supporting means have an air cylinder.

15. An apparatus according to claim 14, wherein said linear motor has a permanent magnet, a coil, and a member for holding said coil and at least one of said coil holding member and said coil is provided with a pipe line for permitting the flow of refrigerant.

16. An apparatus according to claim 14, wherein said air cylinder has a cylinder, a piston, and a rolling seal.

17. An apparatus according to claim 16, wherein each of the horizontal cross sections of said cylinder, said piston, and said rolling seal has a shape of a pair of semi-circular arches and a pair of parallel straight lines connecting said semicircular arches.

18. An apparatus according to claim 14, further comprising adjusting means for adjusting the pressure within said air cylinder.

19. An apparatus according to claim 18, wherein said adjusting means use the pressure within said air cylinder as a feedback signal.

20. An apparatus according to claim 18, wherein said adjusting means use a current signal of said linear motor as a feedback signal.

* * * * *

UNITED STATES PATENT AND TRADEMARK OFFICE
CERTIFICATE OF CORRECTION

PATENT NO. : 5,701,041
DATED : December 23, 1997
INVENTOR(S) : Kotaro AKUTSU et al.

It is certified that error appears in the above-identified patent and that said Letters Patent is hereby corrected as shown below:

COLUMN 1:

Line 44, "the" (second occurrence) should be deleted.
Line 45, "causing" should read --to cause--.

COLUMN 3:

Line 30, "tare" should read --weight--.

COLUMN 8:

Line 8, "base" should read --base,--.

Signed and Sealed this

Thirtieth Day of June, 1998

*Attest:*

BRUCE LEHMAN

*Attesting Officer*  *Commissioner of Patents and Trademarks*